(12) United States Patent
Li et al.

(10) Patent No.: US 12,288,792 B2
(45) Date of Patent: Apr. 29, 2025

(54) ELECTRONIC DEVICE

(71) Applicant: Innolux Corporation, Miao-Li County (TW)

(72) Inventors: Tony Li, Tainan (TW); Lavender Cheng, Tainan (TW); Joe Liu, Hsinchu (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 18/504,033

(22) Filed: Nov. 7, 2023

(65) Prior Publication Data

US 2024/0072072 A1   Feb. 29, 2024

Related U.S. Application Data

(63) Continuation of application No. 17/409,960, filed on Aug. 24, 2021, now Pat. No. 11,848,333.

(51) Int. Cl.
H01L 27/12 (2006.01)

(52) U.S. Cl.
CPC ................................ H01L 27/124 (2013.01)

(58) Field of Classification Search
CPC . G02F 1/13458; G02F 1/13452; H01L 27/124
See application file for complete search history.

(56) References Cited

U.S. PATENT DOCUMENTS

2017/0012056 A1* 1/2017 Lee ..................... H01L 27/124
2018/0063970 A1* 3/2018 Ha ....................... G02F 1/13458

* cited by examiner

Primary Examiner — James A Dudek
(74) Attorney, Agent, or Firm — Patterson + Sheridan, LLP

(57) ABSTRACT

An electronic device includes a substrate and a first signal line. The substrate has an edge, an active region and a peripheral region, wherein the peripheral region is located between the active region and the edge. The first signal line is disposed in the peripheral region, and extends along a first direction which is perpendicular to an extension direction of the edge. The first signal line has a line portion and an end portion. The end portion has a first end point and a second end point. Along a second direction which is perpendicular to the first direction, a distance between the first end point and the line portion is different from a distance between the second end point and the line portion.

5 Claims, 8 Drawing Sheets

ELECTRONIC DEVICE

CROSS REFERENCE TO RELATED APPLICATIONS

This application is a Continuation of U.S. patent application Ser. No. 17/409,960, filed Aug. 24, 2021, the entirety of which is incorporated by reference herein.

BACKGROUND OF THE DISCLOSURE

Field of the Disclosure

The present disclosure relates to an electronic device, and in particular it relates to an electronic device with less parasitic capacitance.

Description of the Related Art

Parasitic capacitance generated between two signal lines may cause an increase in power consumption, and the electrical signal performance may be affected. Therefore, a new design for decreasing the parasitic capacitance between the two signal lines is needed.

BRIEF SUMMARY OF THE DISCLOSURE

An embodiment of the disclosure provides an electronic device, which includes a substrate and a first signal line. The substrate has an edge, an active region and a peripheral region, wherein the peripheral region is located between the active region and the edge. The first signal line is disposed in the peripheral region, and extends along a first direction which is perpendicular to an extension direction of the edge. The first signal line has a line portion and an end portion. The end portion has a first end point and a second end point. Along a second direction which is perpendicular to the first direction, a distance between the first end point and the line portion is different from a distance between the second end point and the line portion

BRIEF DESCRIPTION OF THE DRAWINGS

The disclosure can be fully understood by reading the subsequent detailed description and examples with references made to the accompanying drawings, wherein.

DETAILED DESCRIPTION OF THE DISCLOSURE

Figure 1:
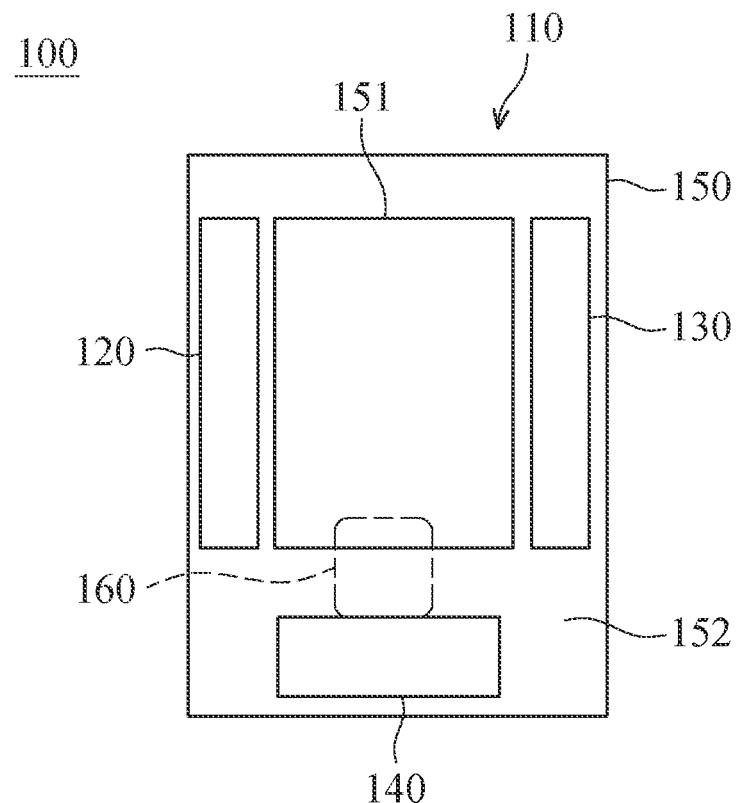
FIG. 1 is a schematic view of an electronic device according to an embodiment of the disclosure.

In order to make objects, features and advantages of the disclosure more obvious and easily understood, the embodiments are described below, and the detailed description is made in conjunction with the drawings. In order to help the reader to understand the drawings, the multiple drawings in the disclosure may merely depict a part of the entire device, and the specific components in the drawing are not drawn to scale.

The specification of the disclosure provides various embodiments to illustrate the technical features of the various embodiments of the disclosure. The configuration, quantity, and size of each component in the embodiments are for illustrative purposes only, and are not intended to limit the disclosure. In addition, if the reference number of a component in the embodiments and the drawings appears repeatedly, it is for the purpose of simplifying the description, and does not mean to imply a relationship between different embodiments.

Furthermore, use of ordinal terms such as "first", "second", etc., in the specification and the claims to describe a claim element does not by itself connote and represent the claim element having any previous ordinal term, and does not represent the order of one claim element over another or the order of the manufacturing method, either. The ordinal terms are used merely as labels to distinguish one claim element having a certain name from another element having the same name.

The term "including" or "comprising" mentioned in the entire specification and claims is an open term, so it should be interpreted as "including but not limited to".

It will be understood that when an element or layer is referred to as being "on", "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening, elements or layers present. As used herein, the term "and/or" includes any or all combinations of one or more of the associated listed items.

Directional phrases used herein include, for example: "upper", "lower", "front", "rear", "left", "right", etc., refer to the orientation of the figures. Accordingly, the directional terminology is used for purposes of illustration and is in no way limiting.

In the disclosure, the thickness, length, and width may be measured by using an optical microscope (OM), and the thickness or length may be measured from a section image in a scanning electron microscope (SEM), but the disclosure is not limited thereto. In addition, there may be a certain error in any two values or directions used for comparison.

It will be understood that, although the terms first, second, etc., may be used herein to describe various elements, components, regions, layers, and/or sections, these elements, components, regions, layers, and/or sections should not be limited by these terms. These terms are used primarily to distinguish one element, component, region, layer, or section from another element, component, region, layer, or section. Thus, a first element, component, region, layer, or section discussed in the specification could be termed a second element, component, region, layer, or section in the claims without departing from the teachings of the disclosure.

In the text, the terms "substantially" or "approximately" usually means within a range of 20%, 10%, 5%, 3%, 2%, 1%, or within 0.5% of a given value. The quantity given here is an approximate quantity. That is, without the specific description of "substantially" or "approximately", the meaning of "substantially" or "approximately" may still be implied.

In the disclosure, the technical features of the various embodiments may be replaced or combined with each other to complete other embodiments without being mutually exclusive.

Figure 2:
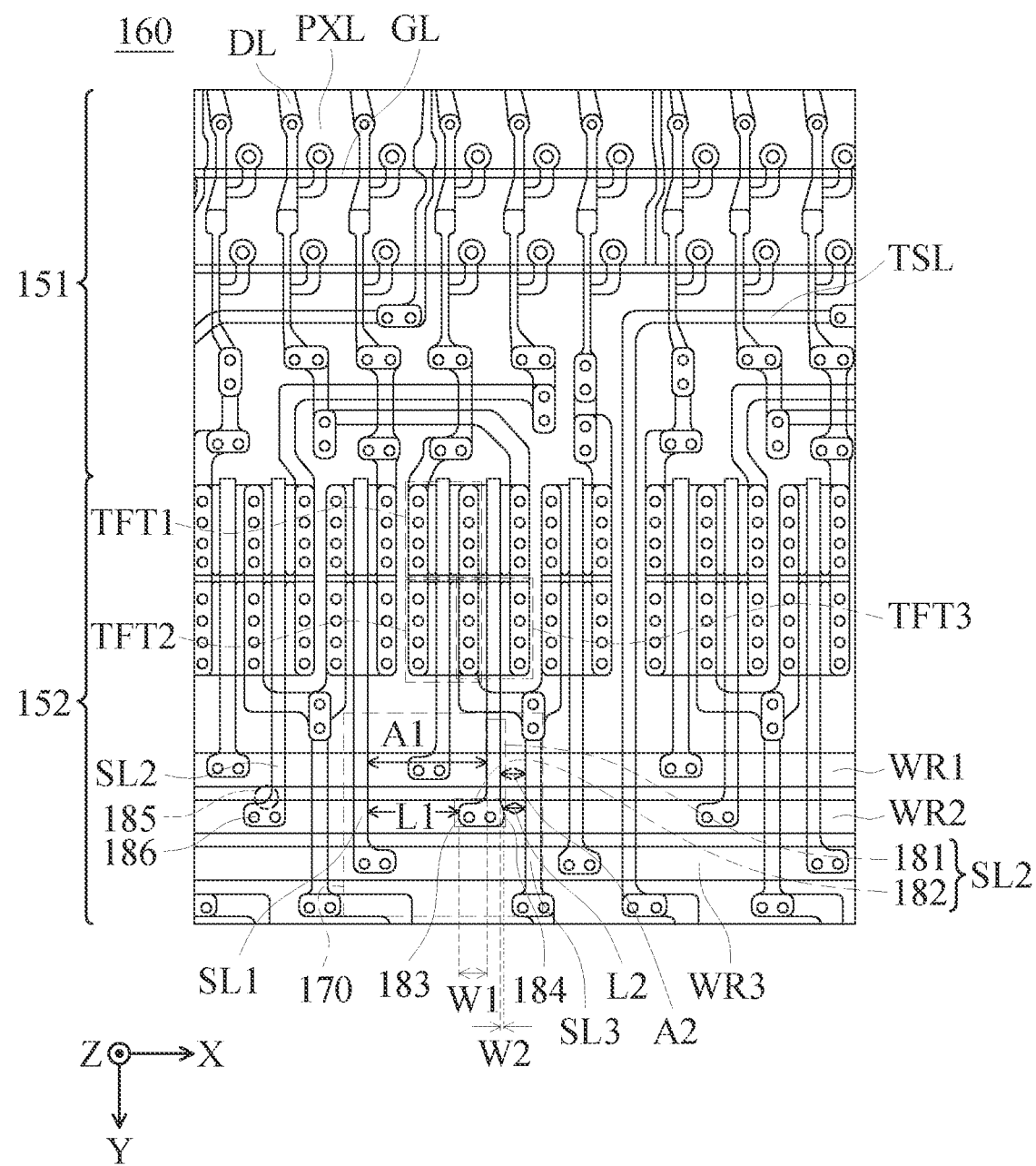
FIG. 2 is an enlarged schematic view of a circuit layout within a dashed region 160 of the electronic device in FIG. 1.

FIG. 1 is a schematic view of an electronic device according to an embodiment of the disclosure. FIG. 2 is an enlarged schematic view of a circuit layout within a dashed region 160 of the electronic device in FIG. 1. In an embodiment, the electronic device 100 may include display mediums such as liquid-crystal (LC), light-emitting diode (LED), quantum dot (QD), fluorescence, phosphor, other suitable materials, or a combination thereof, but the disclosure is not limited thereto. The light-emitting diode may include, for example, an organic light-emitting diode (OLED), a mini light-emitting diode (mini LED), a micro light-emitting diode (micro LED) or a quantum dot light-emitting diode (QLED/QDLED), but the disclosure is not limited thereto.

In some embodiments, the electronic device 100 may be a display device, an antenna device, a sensing device. The display device may be a touch display device, a curved display device or a free shape display device, a bendable or flexible display device, but the disclosure is not limited thereto. The antenna device may be, for example, a liquid-crystal antenna, but the disclosure is not limited thereto.

It should be noted that the electronic device 100 may be any arrangement and combination of the above devices, but the disclosure is not limited thereto. In addition, the appearance of the electronic device 100 may be rectangular, circular, polygonal, a shape with curved edges, or other suitable shapes. The electronic device 100 may include peripheral system, such as a driving system, a control system, a light source system, a shelf system, etc., to support the display device or the antenna device.

In an embodiment, the electronic device 100 may be a display device, but it is only an example to describe the technical features, the disclosure is not limited thereto. Please refer to FIG. 1 and FIG. 2. The electronic device 100 may include a display panel 110. The display panel 110 may at least include a driving unit 120, a driving unit 130 and a driving unit 140, a substrate 150, a signal line SL1, a signal line SL2, and a signal line SL3. The substrate 150 has an active region 151 and a peripheral region 152 adjacent to the active region 151.

In the embodiment, the active region 151 is an area in which the working units are disposed, and the working units may be sub-pixels of the display, but the disclosure is not limited thereto. For example, in a touch sensing device, the working units may be the sensing units of a touch screen, if the electronic device is a liquid-crystal antenna device, the working units may be the antenna units of the liquid-crystal antenna.

There are at least a sub-pixel PXL, a data line DL, a scan line GL and a touch signal line TSL disposed in the active region 151, as shown in FIG. 2, but the disclosure is not limited thereto. In addition, the sub-pixel PXL at least includes a thin film transistor, and the thin film transistor is coupled to the data line DL and the scan line GL, but the disclosure is not limited thereto. The touch signal line TSL may be coupled to a touch unit. It should be noted that in some embodiments, there is no touch signal line TSL in the active region.

The driving unit 120, the driving unit 130 and the driving unit 140 are disposed in the peripheral region 152. The driving unit 120 and the driving unit 130 are disposed at two opposite sides of the active region 151. In the embodiment, the driving unit 120 and the driving unit 130 may be respectively a gate-on-panel (GOP) structure or another suitable gate driver circuit, but the disclosure is not limited thereto.

As shown in FIG. 2, the signal line SL1, the signal line SL2 and the signal line SL3 are disposed in the peripheral region 152. For example, a part of the signal line SL1, a part of the signal line SL2 and a part of the third signal line SL3 are located in a region 170, as shown in FIG. 2, but the disclosure is not limited thereto. The signal line SL1, the signal line SL2 and the signal line SL3 are arranged along a first direction X which may be the extension direction of the scan line GL, or extending along a second direction Y which may be the extension direction of the data line DL, the second direction Y is different from the first direction X, but the layout of the signal lines SL1 to SL3 is not limited thereto. For example, in some embodiment, the signal line SL1, the signal line SL2 and the signal line SL3 are arranged along the second direction Y and extending along a first direction X. In addition, the signal line SL1, the signal line SL2 and the third signal line SL3 may be, for example, disposed in the same layer.

In the embodiment, the signal line SL2 has a line portion 181 and an end portion 182. The end portion 182 has an end point 183 adjacent to the signal line SL1 and an end point 184 adjacent to the signal line SL3. Specifically, the end point 183 may refer to a point closest to the signal line SL1, and the end point 184 may refer to a point closest to the signal line SL3. It should be noted that the signal line SL1 and signal line SL3 are adjacent to the signal line SL2, and the signal line SL1 and signal line SL3 are overlapped with the end portion 182 of the signal line SL2 in the first direction X, as shown in FIG. 2.

In the first direction X, a distance A1 is between the signal line SL1 and the line portion 181, a distance A2 is between the line portion 181 and the signal line SL3, a distance W1 is between the end point 183 and the line portion 181, and a distance W2 is between the end point 184 and the line portion 181. Specifically, the distance A1 may refer to a largest distance between the signal line SL1 and the line portion 181 in the first direction X, the distance A2 may refer to a largest distance between the signal line SL3 and the line portion 181 in the first direction X, the distance W1 may refer to a distance between the end point 183 and the line portion 181 in the first direction X, and the distance W2 may refer to a distance between the end point 184 and the line portion 181 in the first direction X.

In the embodiment, the distance A1 may be greater than the distance A2, and the distance W1 may be greater than the distance W2. Therefore, the location of the end portion 182 may be shifted toward the signal line SL1, and the sum of the parasitic capacitance between the signal line SL1 and the end portion 182 and the parasitic capacitance between the end portion 182 and signal line SL3 may be decreased, the power consumption is decreased, or the electric signal performance is improved.

Figure 3:
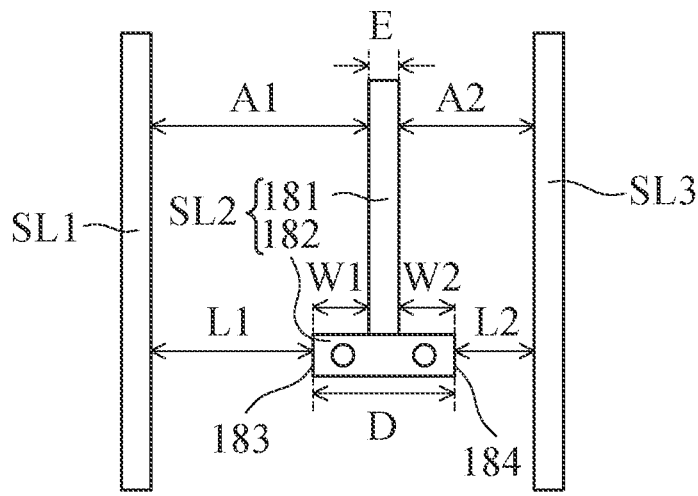
FIG. 3 is an enlarged schematic diagram of a dashed region 170 of the electronic device in FIG. 2.
Figure 4:
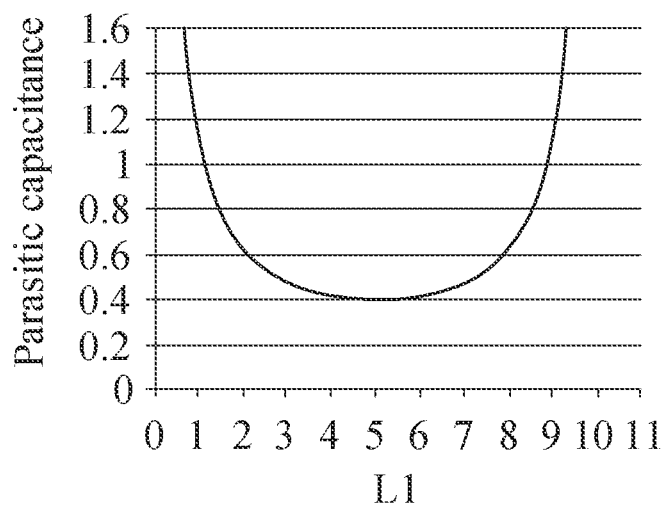
FIG. 4 is a waveform diagram of a corresponding relationship of parasitic capacitance and a distance according to an embodiment of the disclosure.

Please refer to FIG. 3. In some embodiments, in the first direction, a distance between the end point 183 and the signal line SL1 is defined as L1, a distance between the end point 184 and the signal line SL3 is defined as L2, a width of the end portion 182 is defined as D, and a width of the line portion 181 is defined as E, as shown in FIG. 3. Specifically, the width D is a largest width of the end portion 182 in the first direction, and the width E is a largest width of the line portion 181 in the first direction, when the distance W1 and distance W2 have the same length, the distances W1 and W2 are equal to (D-E)/2. Furthermore, the distance A1, the distance A2, the distance L1, the distance L2, the width D and the width E may be expressed by the following equation (1):

$$(L1,L2)_{min} > (A1,A2)_{min} - (D-E)/2 \quad (1)$$

wherein $(L1, L2)_{min}$ indicates that a minimum value of the distance L1 and the distance L2 is taken, and $(A1, A2)_{min}$ indicates that a minimum value of the distance A1 and the distance A2 is taken. Please refer to FIG. 4. In the embodiment, assume that L1+L2=10, but the disclosure is not limited thereto. As shown in FIG. 4, it can be seen that when the distance L1 is closer to 5, the parasitic capacitance is closer to the lowest value. That is, when the distance L1 is equal to the distance L2 (i.e., L1=L2=5), the parasitic capacitance has a minimum value. Therefore, according to equation (1), the value of $(L1, L2)_{min}$ is increased, it indicates that the end portion 183 has been shifted to increase the distance between the end portion 182 and the signal line (e.g., signal line SL3) which is more adjacent to the line portion 181 of the signal line SL2, and the sum of the parasitic capacitance between the signal line SL1 and the end portion 182 and the parasitic capacitance between the end portion 182 and signal line SL3 may be decreased, the power consumption is decreased, or the electric signal performance is improved.

In some embodiments, the ratio of the distance L2 to the distance A2 may be in a range from 0.7 to 1.3 (0.7≤L2/A2≤1.3), but the disclosure is not limited thereto. Accordingly, the profile of the line portion 181 and the end portion 182 may be L-shaped or inverted L-shaped. Therefore, the shifting range of the end portion 182 may be limited to reduce the circuit complexity.

Figure 5:
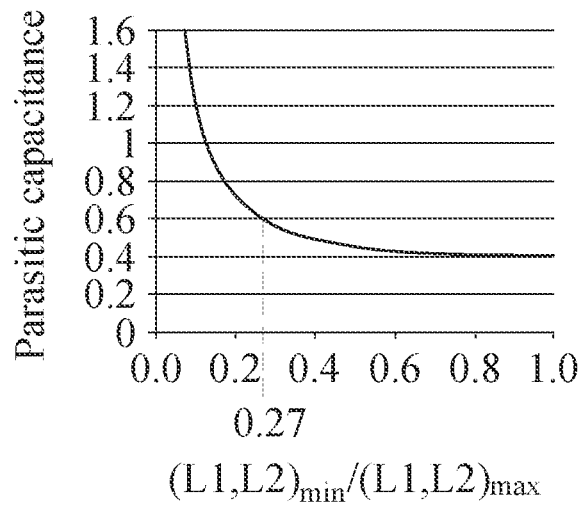
FIG. 5 is a waveform diagram of a corresponding relationship of parasitic capacitance and a ratio of two distances according to an embodiment of the disclosure.

Please refer to FIG. 5. In some embodiments, the distance L1 and the distance L2 may be expressed by the following equation (2):

$$(L1,L2)_{min}/(L1,L2)_{max} > 0.27 \quad (2)$$

wherein $(L1, L2)_{max}$ indicates that a maximum value of the distance L1 and the distance L2 is taken. As shown in FIG. 5, it can be seen that when the ratio in equation (2) is equal to 0.27, the parasitic capacitance (e.g., 0.6) may be 50% higher than the minimum value (e.g., 0.4), and if the ratio of the distance L1 and the distance L2 is less than 0.27, the parasitic capacitance may be rapidly increased. Therefore, according to equation (2), the shifting range of the end portion 182 may be limited to ensure that the parasitic capacitance is not too large, and the power consumption is decreased, or the electric signal performance is improved. Furthermore, in some embodiments, $(L1, L2)_{min}/(L1, L2)_{max}$ may further be equal to or less than 1, i.e., $0.27<(L1, L2)_{min}/(L1, L2)_{max}≤1$, and the same effect may be substantially achieved.

Please refer to FIGS. 1 and 2. In some embodiments, the signal line SL2 may have an intermediate portion 185 connecting the line portion 181 and the end portion 182, and a part of the profile of the intermediate portion 185 is curved. Therefore, the curved profile may improve the electromagnetic interference (EMI).

In the embodiment, the display panel 110 further comprises a wire WR1, a wire WR2 and a wire WR3. The wire WR1, the wire WR2 and the wire WR3 are disposed in the peripheral region, extending along the first direction X. The wire WR2 is located between the wire WR1 and the wire WR3. In the embodiment, the wire WR1, the wire WR2 and the wire WR3 may receive the gate signals from the driving unit 140, and the gate signals are used to control the switching sequence of at least one demultiplexer (DeMUX). In addition, in the embodiment, the signal line SL1, the signal line SL2 and the signal line SL3 may be signal lines of the demultiplexer. Furthermore, the demultiplexer is coupled to the data line DL. But it should be noted that the function of the wires WR1 to WR3 is not limited thereto.

In some embodiments, an insulating layer is disposed between the signal line SL2 and the wire WR2, the insulating layer has two vias 186, and the signal line SL2 and the wire WR2 are coupled through the vias 186. In addition, the signal line SL1 may be coupled to the wire WR3, and the gate signal is transmitted to the demultiplexer through the signal line SL1 and the wire WR3. The signal line SL3 may receive the data signal from the driving unit 140 and transmit the data signal to the demultiplexer. Then, the demultiplexer transmits the data signal to the data line DL.

In some embodiments, the signal line SL1, the signal line SL2 and the signal line SL3 are made of a first layer, the wire WR1, the wire WR2 and the wire WR3 are made of a second layer. The first layer and the second layer are not in a same plane. At least one of the first signal line SL1, the signal line SL2 and the signal line SL3 partially overlaps at least one of the wire WR1, the wire WR2 and the wire WR3. For example, the signal line SL1 partially overlaps the wire WR1, the wire WR2 and the wire WR3. The signal line SL2 partially overlaps the wire WR1 and the wire WR2. The signal line SL3 partially overlaps the wire WR1, the wire WR2 and the wire WR3.

In some embodiments, the end portion 182 may be disposed in an area where the signal line SL2 and the wire WR2 are overlapped, but the disclosure is not limited thereto. In addition, the line portion 181 may be disposed in an area where the signal line SL1 and the wire WR1 are overlapped, but the disclosure is not limited thereto.

In some embodiments, the wire WR1 of the peripheral region 152 may be coupled to two adjacent thin film transistors TFT1 and TFT2 of a plurality of thin film transistors, but the disclosure is not limited thereto. In some embodiments, there are a plurality of thin film transistors disposed in the peripheral region 152, and one of the signal line SL1, the signal line SL2 and the signal line SL3 is coupled to the gate electrode of at least one of the thin film transistors, but the disclosure is not limited thereto. It should be noted that in a top view, a thin film transistor TFT1 may have a source electrode to receive a signal from a signal source, a drain electrode to transmit the received signal to the active region 151, and a gate electrode to control if the thin film transistor TFT1 is turned on. Two neighboring thin film transistors may use a same source electrode, drain electrode and/or gate electrode. For example, transistors TFT1 and TFT2 may use a same gate electrode, and transistors TFT2 and TFT3 use a same source electrode.

In some embodiments, there are a plurality of thin film transistors disposed in the peripheral region 152, and one of the signal line SL1, the signal line SL2 and the signal line SL3 may be coupled to a drain electrode or a source electrode of at least one of the thin film transistors, but the disclosure is not limited thereto. In some embodiments, there are a plurality of touch units (not shown) disposed in the active region 151, and one of the signal line SL1, the signal line SL2 and the signal line SL3 is coupled to at least one of the touch units, but the disclosure is not limited thereto. In some embodiments, one of the signal line SL1, the signal line SL2 and the signal line SL3 may be coupled to other electrical components. In some embodiments, there are a plurality of thin film transistors disposed in the peripheral region 152, and a channel layer of at least one of the thin film transistors may include polysilicon materials or metal oxide materials.

Figure 6:
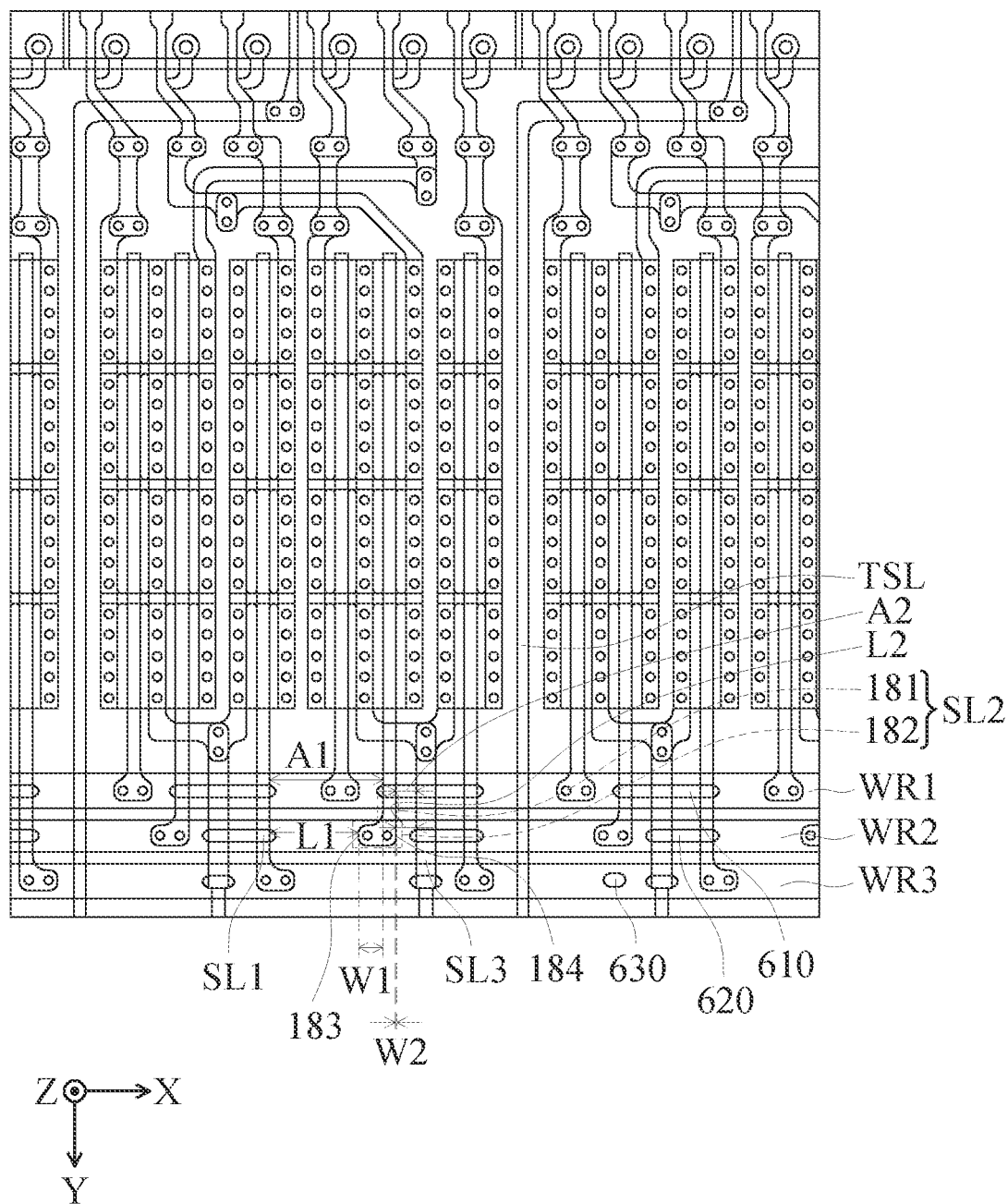
FIG. 6 is an enlarged schematic diagram of another circuit layout in a dashed region 160 of the electronic device in FIG. 1.

Please refer to FIGS. 1 and 6. FIG. 6 is an enlarged schematic diagram of another circuit layout in a dashed region 160 of the electronic device in FIG. 1. The embodiment in FIG. 6 is similar to the embodiment in FIG. 2. In the embodiment, the signal line SL1, the signal line SL2, the signal line SL3, the line portion 181, the end portion 182, the end point 183, the end point 184, the wire WR1, the wire WR2, the wire WR3, the distance A1, the distance A2, the distance W1, the distance W2, the distance L1 and the distance L2 may refer to the embodiments of FIGS. 2 to 5, and the description thereof is not repeated herein. In FIG. 6, the wire WR1 has at least one opening 610, the wire WR2 has at least one opening 620, and the wire WR3 has at least one opening 630. In the embodiment, when the first wire WR1 has the opening 610, the line portion 181 of the signal line SL2 may refer to a portion closest to the end portion 182. To be more specific, the line portion 181 is defined as a part of signal line SL2 overlapped with the wire WR1 and located between the opening 610 of the wire WR1 and the end portion 182.

Figure 7:
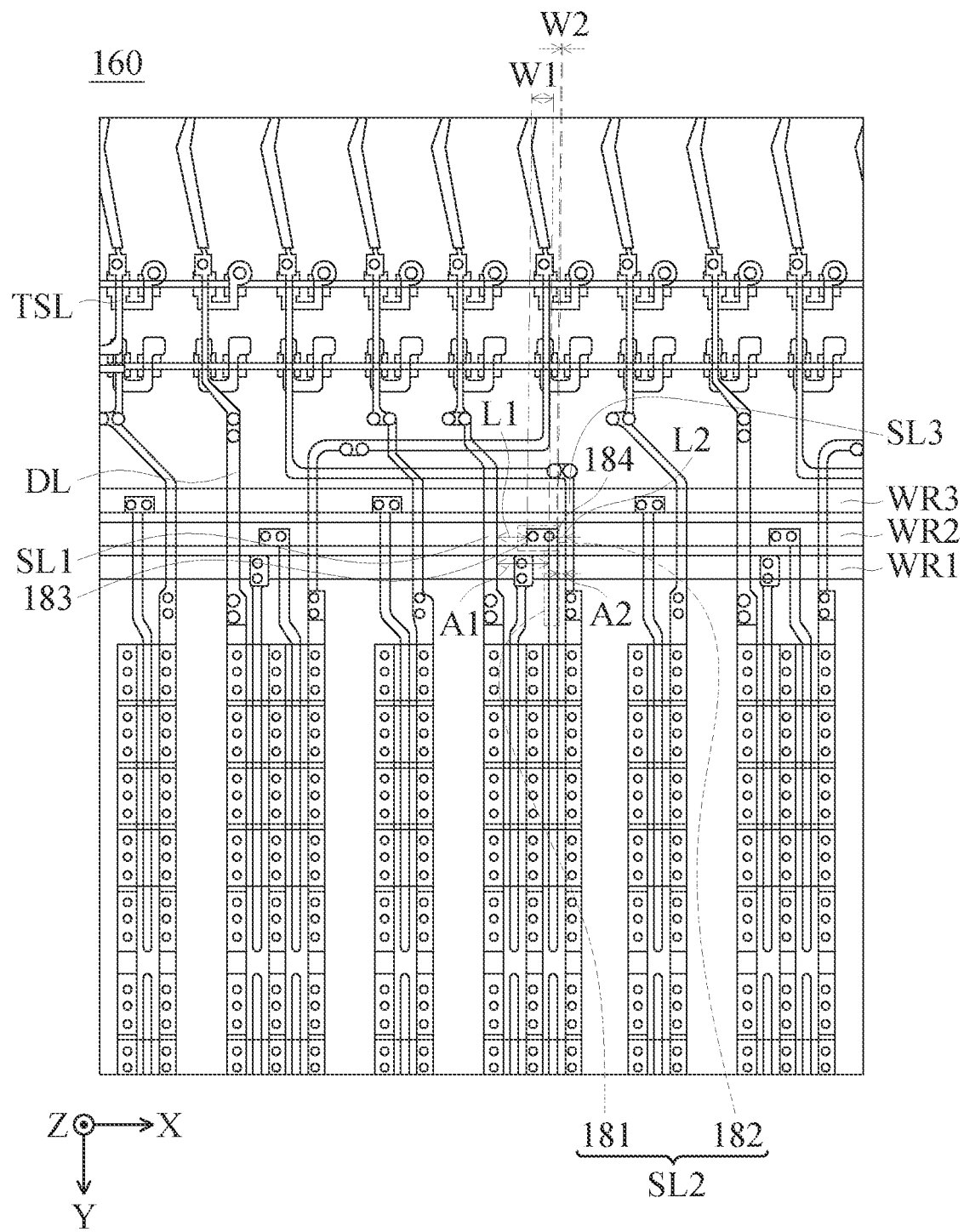
FIG. 7 is an enlarged schematic diagram of another circuit layout in a dashed region 160 of the electronic device in FIG. 1.

Please refer to FIGS. 1 and 7. FIG. 7 is an enlarged schematic diagram of another circuit layout in a dashed region 160 of the electronic device in FIG. 1. The embodiment in FIG. 7 is similar to the embodiment in FIG. 2. In the embodiment, the signal line SL1, the signal line SL2, the signal line SL3, the line portion 181, the end portion 182, the end point 183, the end point 184, the wire WR1, the wire WR2, the wire WR3, the distance A1, the distance A2, the distance W1, the distance W2, the distance L1 and the distance L2 may refer to the embodiments of FIGS. 2-5, and the description thereof is not repeated herein. In FIG. 7, a part of the profile of the end portion 182 is curved. For example, the four corners of the end portion 182 are curved. Therefore, the possibility of electrical discharge at a tip of the end portion 182 may be decreased. In addition, in the embodiment, the vias corresponding to end portions of some signal lines are arranged in the first direction, and the vias corresponding to the end portions of some other signal lines are arranged in the second direction.

Figure 8:
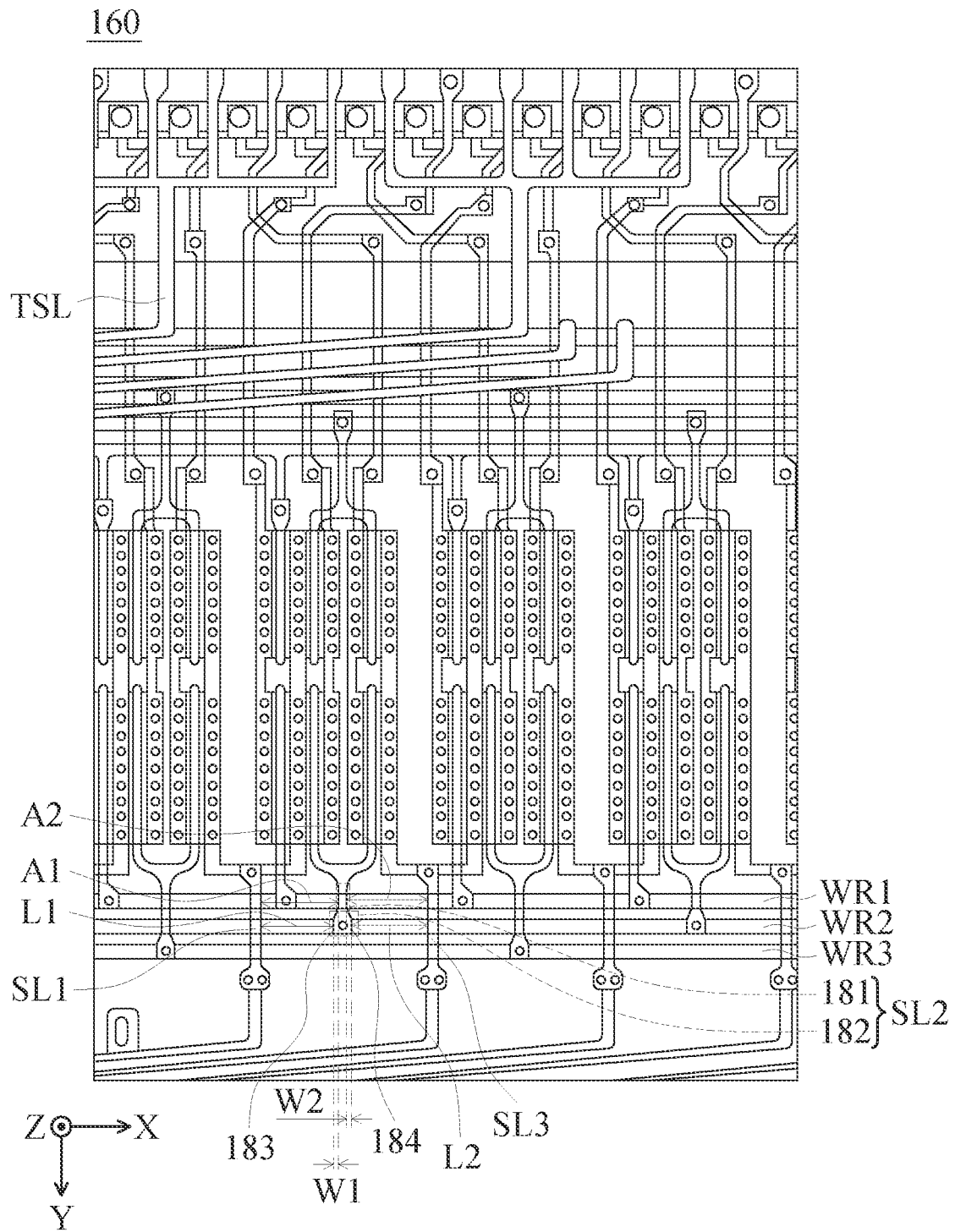
FIG. 8 is an enlarged schematic diagram of another circuit layout in a dashed region 160 of the electronic device in FIG. 1.

Please refer to FIGS. 1 and 8. FIG. 8 is an enlarged schematic diagram of another circuit layout in a dashed region 160 of the electronic device in FIG. 1. The embodiment in FIG. 8 is similar to the embodiment in FIG. 2. In the embodiment, the signal line SL1, the signal line SL2, the signal line SL3, the line portion 181, the end portion 182, the end point 183, the end point 184, the wire WR1, the wire WR2, the wire WR3, the distance A1, the distance A2, the distance W1, the distance W2, the distance L1 and the distance L2 may refer to the embodiments of FIGS. 2-5, and the description thereof is not repeated herein. In FIG. 8, there is one via corresponding to the end portion 182, and the signal line SL2 and the wire WR2 are coupled through the via. In addition, the touch signal line TSL may be located in another layer. Furthermore, the signal line SL2 couples at least two gate electrodes of the thin film transistors of the demultiplexer. Moreover, the signal line SL1 and the signal line SL3 may receive the data signals from the driving unit and transmit the data signals to the demultiplexers. Then, the demultiplexers transmit the data signals to the data lines DL.

Figure 9:
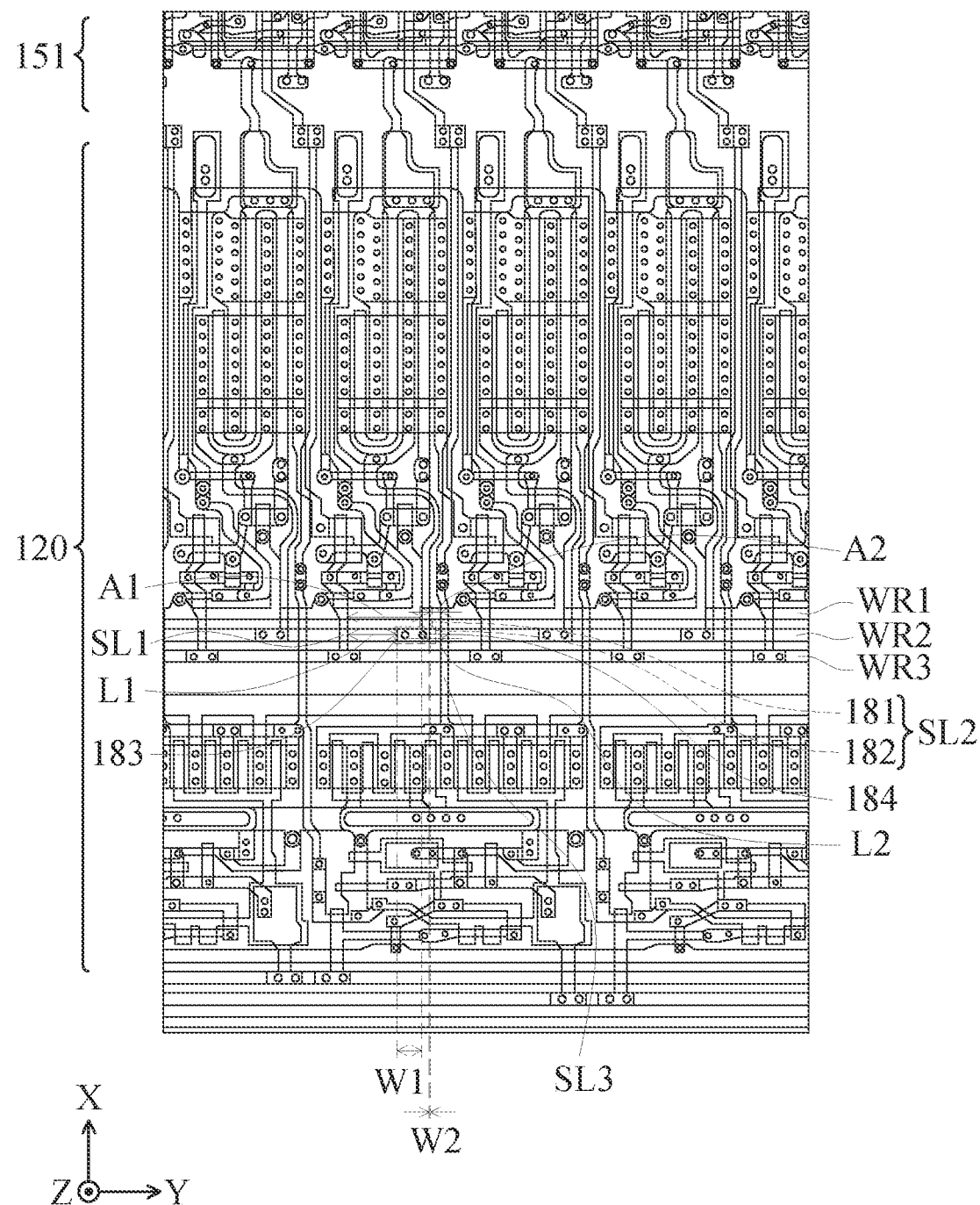
FIG. 9 is an enlarged schematic diagram of a circuit layout in a dashed region 160 of the electronic device in FIG. 1.

FIG. 9 is an enlarged schematic diagram of a circuit layout in a dashed region 160 of the electronic device in FIG. 1. In FIG. 9, the signal line SL1, the signal line SL2, the signal line SL3, the line portion 181, the end portion 182, the end point 183, the end point 184, the wire WR1, the wire WR2, the wire WR3 are disposed in the driving unit 120, but the disclosure is not limited thereto. In some embodiments, the signal line SL1, the signal line SL2, the signal line SL3, the line portion 181, the end portion 182, the end point 183, the end point 184, the wire WR1, the wire WR2, the wire WR3 are disposed in the driving unit 130. In the embodiment, the signal line SL1, the signal line SL2, the signal line SL3, the line portion 181, the end portion 182, the end point 183, the end point 184, the wire WR1, the wire WR2, the wire WR3, the distance A1, the distance A2, the distance W1, the distance W2, the distance L1 and the distance L2 may refer to the embodiments of FIGS. 2-5, and the description thereof is not repeated herein. In some embodiments, the driving unit 120 or the driving unit 130 may be coupled to the data line DL. In other embodiments, the driving unit 120 or the driving unit 130 may be coupled to the scan line GL.

Figure 10:
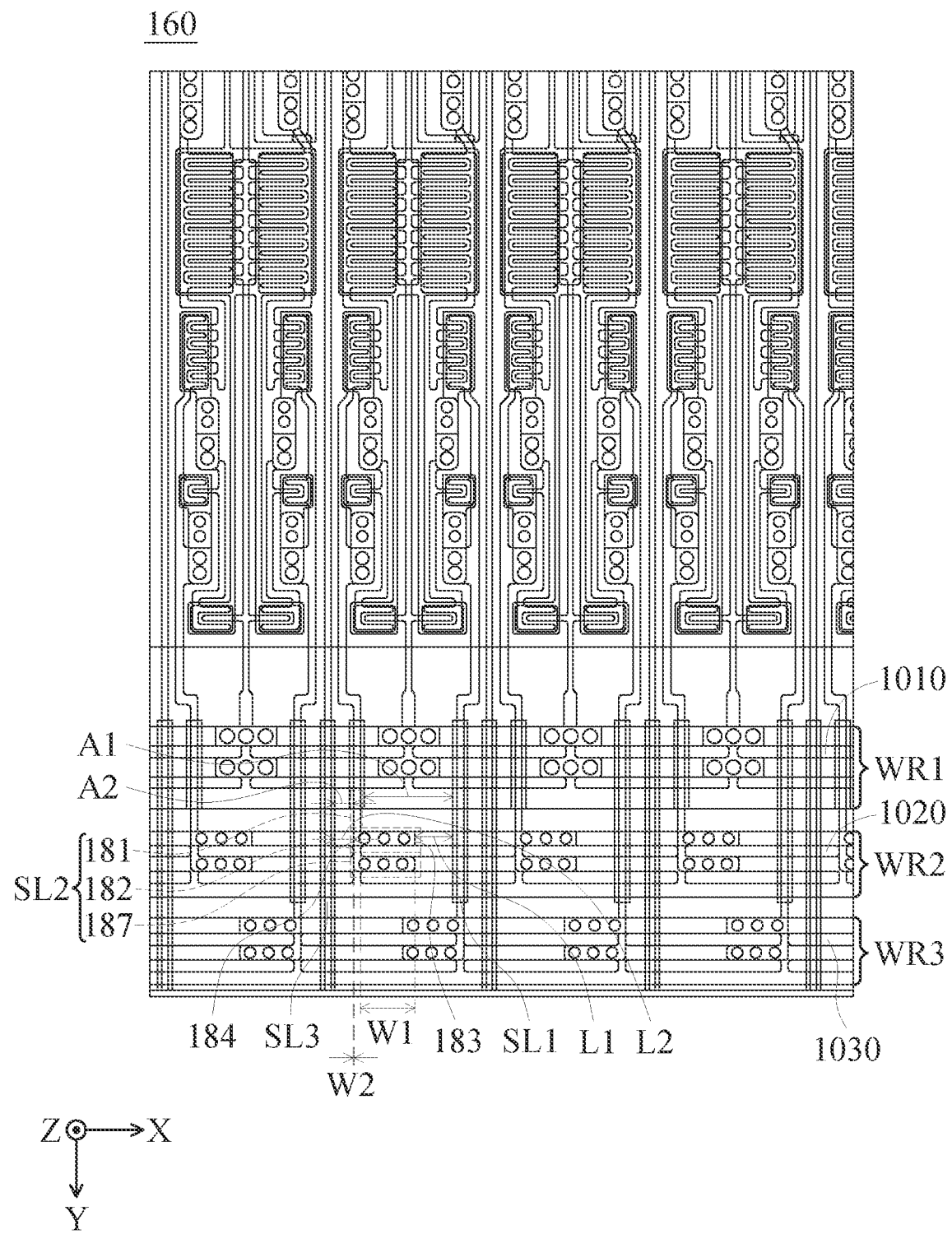
FIG. 10 is an enlarged schematic diagram of another circuit layout in a dashed region 160 of the electronic device in FIG. 1.

FIG. 10 is an enlarged schematic diagram of another circuit layout in a dashed region 160 of the electronic device in FIG. 1. The embodiment in FIG. 10 is similar to the embodiment in FIG. 2. In the embodiment, the signal line SL1, the signal line SL2, the signal line SL3, the line portion 181, the end portion 182, the end point 183, the end point 184, the wire WR1, the wire WR2, the wire WR3, the distance A1, the distance A2, the distance W1, the distance W2, the distance L1 and the distance L2 may refer to the embodiments of FIGS. 2-5, and the description thereof is not repeated herein. In FIG. 10, the wire WR1 has at least one opening 1010, the wire WR2 has at least one opening 1020, and the wire WR3 has at least one opening 1030. In addition, the signal line SL2 may further have an auxiliary end portion 187, and the line portion 181 and the auxiliary end portion 187 are disposed at two opposite sides of the end portion 182, and at least one of the openings 1010, 1020, and 1030 is located between the end portion 182 and the auxiliary end portion 187. In some embodiments, the design of line portion 181, end portion 182 and the auxiliary end portion 187 of the signal line SL2 may also be used in the driving unit 120 or the driving unit 130.

In summary, according to the electronic device the embodiments of the disclosure, the first signal line, the second signal line, and the third signal line are disposed in the peripheral region adjacent to the active region, sequentially arranged along the first direction, and extended along the second direction. The second signal line has the line portion and the end portion. The end portion has the first end point adjacent to the first signal line and the second end point adjacent to the third signal line. In the first direction, the first distance A1 between the first signal line and the line portion is greater than the second distance A2 between the line portion and the third signal line, and the third distance W1 between the first end point and the line portion is greater than the fourth distance W2 between the second end point and the line portion. Therefore, the parasitic capacitance between the two signal lines may be decreased, the power consumption is decreased, or the electric signal performance is improved.

While the disclosure has been described by way of examples and in terms of the preferred embodiments, it should be understood that the disclosure is not limited to the disclosed embodiments. On the contrary, it is intended to cover various modifications, combinations, and similar arrangements (as would be apparent to those skilled in the art). Therefore, the scope of the appended claims should be accorded the broadest interpretation to encompass all such modifications, combinations, and similar arrangements.

What is claimed is:

1. An electronic device, comprising:
a substrate having an edge, an active region and a peripheral region, wherein the peripheral region is located between the active region and the edge;
a first signal line disposed in the peripheral region, and extending along a first direction which is perpendicular to an extension direction of the edge;
a second signal line and a third signal line extending along the first direction, wherein the first signal line is located between the second signal line and the third signal line along a second direction which is perpendicular to the first direction; and
at least one wire, disposed in the peripheral region and extending along the second direction, wherein the first signal line and the at least one wire are coupled through a via;
wherein the first signal line has a first line portion and a first end portion, the first end portion has a first side and a second side, and along the second direction, a distance between the first side and the first line portion is different from a distance between the second side and the first line portion;
wherein the second signal line has a second line portion and a second end portion, the second end portion has a third side and a fourth side, and along the second direction, the distance between the first side and the first line portion is greater than the distance between the second side and the first line portion, a distance between the third side and the second line portion is greater than a distance between the fourth side and the second line portion, the first side is more adjacent to the third side than to the fourth side, and the first side faces the third side.

2. The electronic device according to claim 1, wherein a distance between the first side and the second side along the second direction equals to a maximum width of the first end portion along the second direction.

3. The electronic device according to claim 1, wherein a distance between the second signal line and the first line portion along the second direction is different from a distance between the third signal line and the first line portion along the second direction.

4. The electronic device according to claim 3, wherein the distance between the second signal line and the first line portion is greater than the distance between the third signal line and the first line portion.

5. The electronic device according to claim 1, wherein the first line portion has a first edge and a second edge opposite to the first edge, the first end portion has a first sub portion protruding from an extension line of the first edge and a second sub portion protruding from an extension line of the second edge, and an area of the first sub portion is different from an area of the second sub portion.

* * * * *